US008644171B2

(12) United States Patent
Meany et al.

(10) Patent No.: US 8,644,171 B2
(45) Date of Patent: Feb. 4, 2014

(54) METHOD AND COMPUTER PROGRAM PRODUCT FOR COMPRESSING TIME-MULTIPLEXED DATA AND FOR ESTIMATING A FRAME STRUCTURE OF TIME-MULTIPLEXED DATA

(75) Inventors: James J. Meany, Des Peres, MO (US); Brian K. Predmore, Kent, WA (US)

(73) Assignee: The Boeing Company, Chicago, IL (US)

( * ) Notice: Subject to any disclaimer, the term of this patent is extended or adjusted under 35 U.S.C. 154(b) by 497 days.

(21) Appl. No.: 11/836,496

(22) Filed: Aug. 9, 2007

(65) Prior Publication Data
US 2009/0041021 A1 Feb. 12, 2009

(51) Int. Cl.
*H04L 12/28* (2006.01)
*H04L 12/26* (2006.01)

(52) U.S. Cl.
USPC .......................................... 370/252; 370/394

(58) Field of Classification Search
USPC ....................................................... 370/252
See application file for complete search history.

(56) References Cited

U.S. PATENT DOCUMENTS

| 5,905,768 | A | * | 5/1999 | Maturi et al. ................. 375/364 |
|---|---|---|---|---|
| 6,041,302 | A | * | 3/2000 | Bruekers ....................... 704/503 |
| 6,154,155 | A | | 11/2000 | Hershey et al. |
| 6,266,323 | B1 | * | 7/2001 | Valko et al. ................... 370/230 |
| 6,480,547 | B1 | * | 11/2002 | Chen et al. ............... 375/240.27 |
| 2003/0171095 | A1 | * | 9/2003 | Fujinami ...................... 455/3.04 |
| 2003/0231799 | A1 | * | 12/2003 | Schmidt ......................... 382/244 |
| 2004/0179617 | A1 | * | 9/2004 | Cai et al. ................. 375/240.26 |
| 2004/0247191 | A1 | * | 12/2004 | Napper .......................... 382/238 |
| 2005/0143984 | A1 | * | 6/2005 | Makinen et al. .............. 704/219 |
| 2007/0171931 | A1 | * | 7/2007 | Manjunath et al. ........... 370/435 |
| 2008/0049660 | A1 | * | 2/2008 | Kwan et al. .................... 370/318 |
| 2009/0024395 | A1 | * | 1/2009 | Banba .......................... 704/500 |
| 2009/0252247 | A1 | * | 10/2009 | Lee et al. ....................... 375/267 |
| 2009/0327835 | A1 | * | 12/2009 | Oteri et al. .................... 714/758 |

OTHER PUBLICATIONS

Ian H. Witten, Radford M. Neal, and John G. Cleary,*Arithmetic Coding for Data Compression*, Communications of the ACM, vol. 30, No. 6, pp. 520-540, Jun. 1987.
Declaration of Non-Establishment of International Search Report and Written Opinion for PCT/US2008/070201, dated Nov. 20, 2008.

* cited by examiner

*Primary Examiner* — Brandon Renner
*Assistant Examiner* — Faisal Choudhury
(74) *Attorney, Agent, or Firm* — Alston & Bird LLP

(57) ABSTRACT

A method and computer program product are provided for compressing and, in turn, for estimating the frame structure of time-multiplexed data. The time-multiplexed data may be received without an indication of the frame structure for the time-multiplexed data. As such, the frame structure of the time-multiplexed data may be estimated and the time-multiplexed data may be compressed at least partially in accordance with the estimation of the frame structure. The frame structure may be estimated by representing an estimation of frame structure with a tree structure. The tree structure may include a plurality of leaf nodes associated with a respective estimated signal sequence with a respective sampling rate and interleave location. The tree structure may include a plurality of tree branches with the estimation of the frame structure including at least one of splitting or merging tree branches.

35 Claims, 4 Drawing Sheets

METHOD AND COMPUTER PROGRAM PRODUCT FOR COMPRESSING TIME-MULTIPLEXED DATA AND FOR ESTIMATING A FRAME STRUCTURE OF TIME-MULTIPLEXED DATA

FIELD OF THE INVENTION

Embodiments of the present invention relate generally to the processing of time-multiplexed data and, more particularly, to the compression of time-multiplexed data and/or to the discovery of the frame structure of time-multiplexed data in order to, for example, facilitate improved compression of the data.

BACKGROUND OF THE INVENTION

A plurality of data streams are often interleaved with one another in a time-multiplexed manner. While time-multiplexed data may be generated in a variety of applications, vehicles, such as aircraft, frequently generate flight test, maintenance, or quality assurance data, i.e., telemetry data, from a variety of sensors, and typically encode this data in a time-division multiplexed sequence. These time-multiplexed data sequences are commonly transmitted over aircraft data busses or data links, or stored in mass storage units. For example, commercial aircraft may collect quality assurance data by monitoring and recording various events, transducer measurements and other parameters, thereby facilitating maintenance, aircraft safety and accident investigations. This quality assurance data may be similar in some respects in content and format to "black box" data. The quality assurance data is typically transmitted via a time-division multiplexed data bus, such as an ARINC 717 data bus. The quality assurance data is then recorded for post-flight processing and analysis or downloaded to the ground during flight. In instances in which the quality assurance data is transmitted to the ground, such as to an airline maintenance operations center, while the aircraft is enroute, maintenance personnel may begin preparation and scheduling of repairs for the aircraft before the aircraft arrives at the gate, thereby increasing the speed with which an aircraft may be turned around at a gate between flights and potentially providing meaningful cost saving to the airlines.

Quality assurance and other telemetry or time-multiplexed data may be desirably compressed due to the high data rates at which such data is transmitted. However, time-multiplexed data that is transmitted at lower data rates may also be desirably compressed. For example, while quality assurance data of the type described above has a relatively low data rate, such as about 512 bytes per second, the quality assurance data is collected continuously while an aircraft is in operation. The quality assurance data is generally transmitted in a burst with the voluminous data that is transmitted representing many hours of data and potentially consisting of tens of megabytes. The bandwidth of the downlink may be limited and costly. In order to reduce the cost, time and bandwidth requirements associated with the downloading of the quality assurance data, the quality assurance data may be compressed.

One technique for compressing the quality assurance data is to utilize a text or file compression algorithm, such as a commercial ZIP algorithm. While a text or file compression algorithm will compress the quality assurance data, the extent of the compression is somewhat limited as a text or file compression algorithm does not take advantage of the correlation structure of the data brought about by the interleaving of the plurality of data streams. In this regard, the ZIP compression algorithm and other text or file compression algorithms generally rely on local correlations and, as a result, fail to improve the compression of the quality assurance data by exploiting redundancies in the data that arrives from any one particular data stream or source since the individual data elements from any particular data stream or source are typically widely separated within a time-division multiplexed frame.

Like other time-division multiplexed data, quality assurance data generally consists of multiple interleaved streams of data being provided by different respective data sources. This data may include measurements from various transducers, discrete (bi-level) data, text fields, and numerous other parameters. The different streams of data that comprise the quality assurance data may be interleaved at different respective sample rates which, in one example, range between 8 times per second and once every 64 seconds.

In instances in which the frame structure which defines the manner in which the multiple data streams are interleaved is known, the quality assurance data can be more efficiently compressed. In this regard, compression algorithms may utilize the redundancy within the respective data streams to more efficiently compress the data even though the data streams have been interleaved, widely so in some situations.

The requirement that the frame structure be known to the compression algorithm may impose a logistical burden or, at a minimum, necessitate the transmission of information defining the frame sequence to the compression algorithm, thereby undesirably adding to the network load and, in some instances, congestion. Still further, in some instances, the frame structure may simply not be known. While time-multiplexed data for which the frame structure is unknown may still be compressed to some degree by utilizing text or file compression algorithms, the extent of the compression offered by such compression algorithms may be less than desired in some instances, particularly in light of the voluminous nature of time-multiplexed data in some applications, such as telemetry.

BRIEF SUMMARY OF THE INVENTION

A method, apparatus and computer program product are therefore provided which address at least some of the issues with conventional approaches to the compression of time-multiplexed data and which offer other advantages. In particular, the method, apparatus, and computer program product of embodiments of the present invention permit the discovery of the frame structure of a time-multiplexed data sequence in instances in which the frame sequence is unavailable or otherwise unknown, and even in instances in which a variety of sequences are interleaved at substantially varying rates. In addition, the method, apparatus, and computer program product of embodiments of the present invention also permit the efficient compression of a time-multiplexed data sequence, whether the frame structure is fully, partially, or completely unknown or otherwise unavailable. Based upon the frame sequence of the time-multiplexed data that is discovered, the data may be compressed more efficiently and to a greater degree, thereby improving any subsequent storage and/or transmission of the compressed data.

In accordance with one embodiment, a method and computer program product are provided for compressing time-multiplexed data that includes a plurality of samples. In this regard, a sample is received and the active signal sequence that includes the sample is then determined. The active signal sequence for a sample may be prescribed a priori, as part of a specified frame structure for the time-multiplexed data, or may have been estimated during processing of prior samples. The residual for the current sample may then be determined, based on a model of the active signal sequence. In one embodiment, the residual is computed using a polynomial predictor. The order for the polynomial predictor may be prescribed a priori, or may be estimated during processing of prior samples. This residual may then optionally be quantized, resulting in lossy compression, which provides increased compression at the cost of distortion in the reconstructed signal. The residual value may then be encoded. In one embodiment, the residual is encoded in parts, being first encoded as significant (non-zero) or insignificant (zero), with significant residuals then further encoded in two parts: as sign (plus or minus) and magnitude. In one embodiment, the significance and sign parts of the residual are encoded with a binary arithmetic encoder and the magnitude part of the residual is encoded with an exponential arithmetic encoder, which assumes an exponential distribution of the residual magnitudes. For an embodiment in which a residual is quantized, the polynomial predictor may be operated in reverse sequence to recover a quantized representation of the sample value, thus preventing divergence between the compressor and decompressor. Alternatively, the quantized representation of the sample value may be recovered by simply computing the error due to quantization of the residual (by subtracting the unquantized value of the residual from the quantized value), and adding that error to the original sample value.

In one embodiment, a method and computer program product are provided for estimating the frame structure for time-multiplexed data that includes a plurality of samples. In this embodiment, the time-multiplexed data is received without any specification or with only a partial specification of the frame structure for the time-multiplexed data. As such, the unknown characteristics of the frame structure of the time-multiplexed data must be estimated, and the time-multiplexed data is compressed at least partially in accordance with the estimation of the frame structure. In this regard, the estimated frame structure may be represented using a tree structure. The tree structure includes a plurality of nodes, each of which is associated with a respective signal sequence (out of all the possible signal sequences) with a respective sampling rate and interleave location. For each node in the tree, representing a specific signal sequence with a specific sample rate and interleave location, there are child nodes associated with the sequences obtained by splitting the samples from the sequence for the parent node into multiple interleaved sequences at a reduced rate. The exception to the child nodes occurs for nodes associated with signal sequences sampled at the lowest possible rate of one sample per frame. The nodes for these sequences are located at the extreme opposite end of the tree from the root node, and do not have child nodes, because the associated sequences cannot be split into lower rate sequences. A special node is the root node of the tree, which is associated with the specific signal sequence that contains every sample in the data stream, with sampling at the maximum rate. At any time during the frame estimation process, the active signal sequences in the estimated frame structure are represented by the leaf nodes in the tree structure. The estimated frame structure may be modified by splitting and merging of leaf nodes within the tree structure. More specifically, a leaf node may be split into the associated child nodes (which then become new leaf nodes). This is equivalent to splitting the signal sequence associated with the original leaf node into interleaved sequences at a lower rate. Alternatively, sibling leaf nodes (i.e., leaf nodes which share the same parent) may be merged into the parent node (which then becomes a new leaf node). This is equivalent to merging the interleaved signal sequences associated with the sibling leaf nodes into one signal sequence at a higher rate.

In one embodiment, the process of splitting and merging of nodes in the tree structure is performed to reduce the rate to which the time-multiplexed data may be compressed. In this embodiment, the choice between splitting leaf nodes or merging leaf nodes or leaving leaf nodes unchanged is made to minimize the expected bit rate for the encoding of the time-multiplexed data. In one embodiment, the expected bit rate is represented by the estimated entropy over the leaf nodes. In that embodiment, the choice of splitting, merging, or retaining leaf nodes is made to minimize the entropy summed over the leaf nodes. In some embodiments, the entropy associated with the individual leaf nodes may be estimated as the entropy of the residuals of a predictive coding process applied to the signal sequence. In one embodiment, the predictive coding for the signal sequence is performed using a polynomial predictor, with the entropy for the residuals being estimated based on the use of a Laplacian distribution model for the residuals. In some embodiments, the order for the polynomial predictor is in turn estimated to minimize the mean absolute value of the residual sequence, which in turn is equivalent to minimizing the entropy of the residual sequence.

By providing a technique for applying the compression process separately to interleaved signal sequences within time-multiplexed data, a method and computer program product of embodiments of the present invention permit the data to be compressed more efficiently than if the compression process is applied collectively to all of the time-multiplexed data. Furthermore, by providing a technique for discovering the frame structure of time-multiplexed data in instances in which the frame structure is not otherwise known or provided, a method and computer program product of embodiments of the present invention permit the data to be compressed in an efficient and more complete manner in reliance upon the redundancies which occur in the data of the individual data streams even though the data elements of any particular data stream may be widely separated as a result of the interleaving process. As such, the method and computer program product of embodiments of the present invention thereby permit more thorough compressions than at least some conventional file and text compression algorithms that do not exploit redundancies within a frame structure, but that otherwise may have had to have been utilized in the past as a result of the lack of any indication of the frame structure of the time-multiplexed data.

BRIEF DESCRIPTION OF THE DRAWINGS

Figure 1:
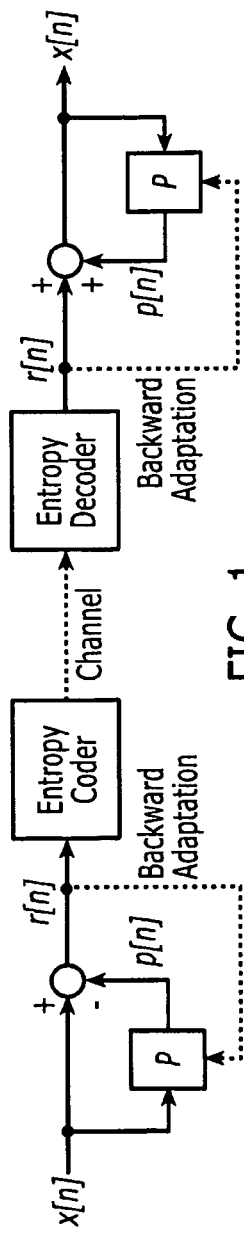
Figure 2:
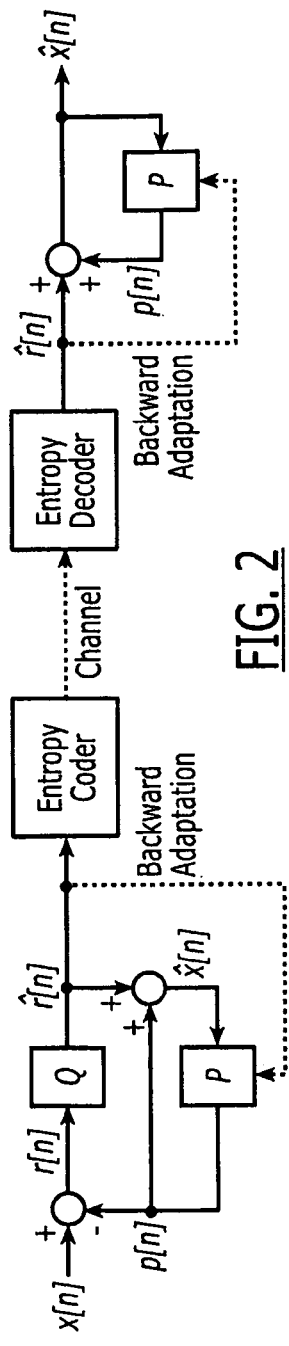
Figure 3:
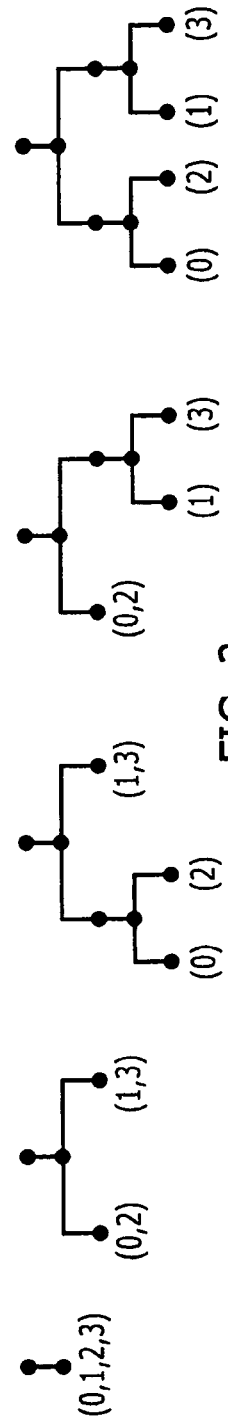
Figure 4A:
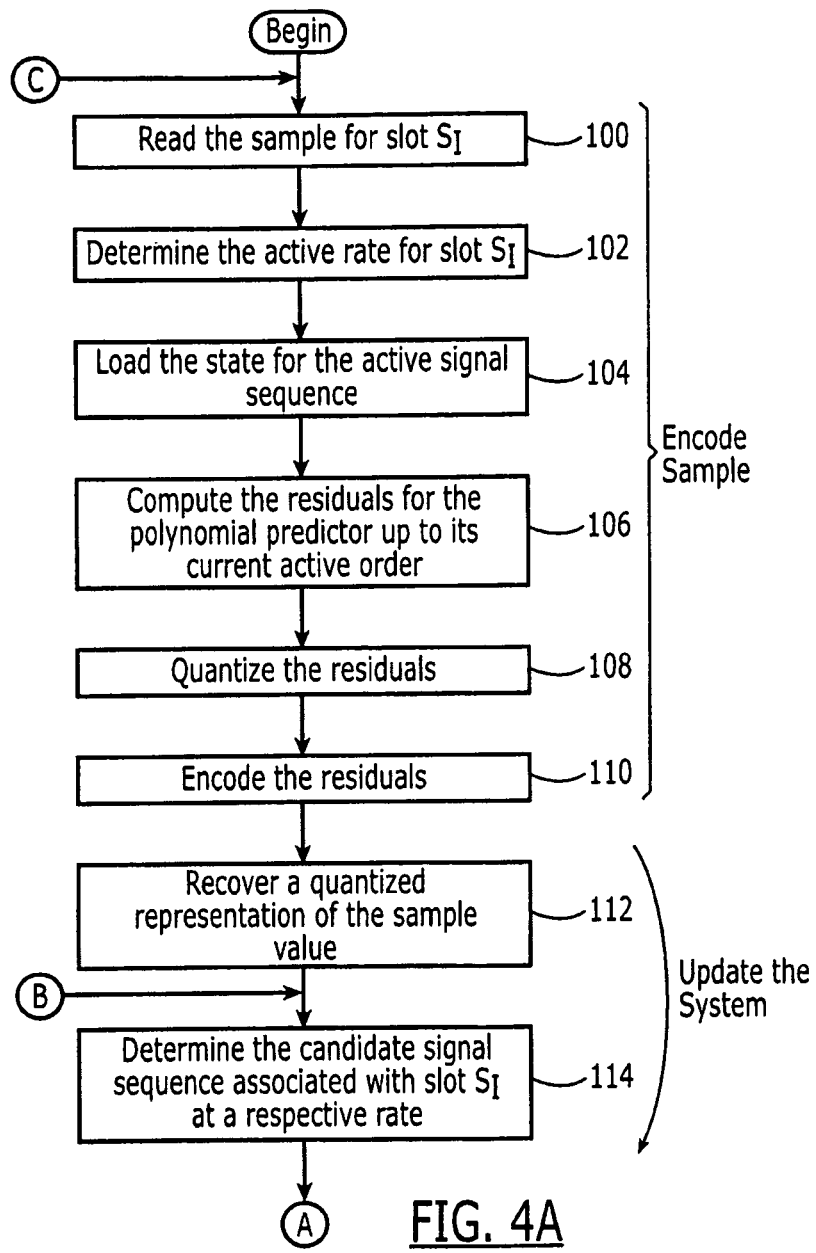
Figure 4B:
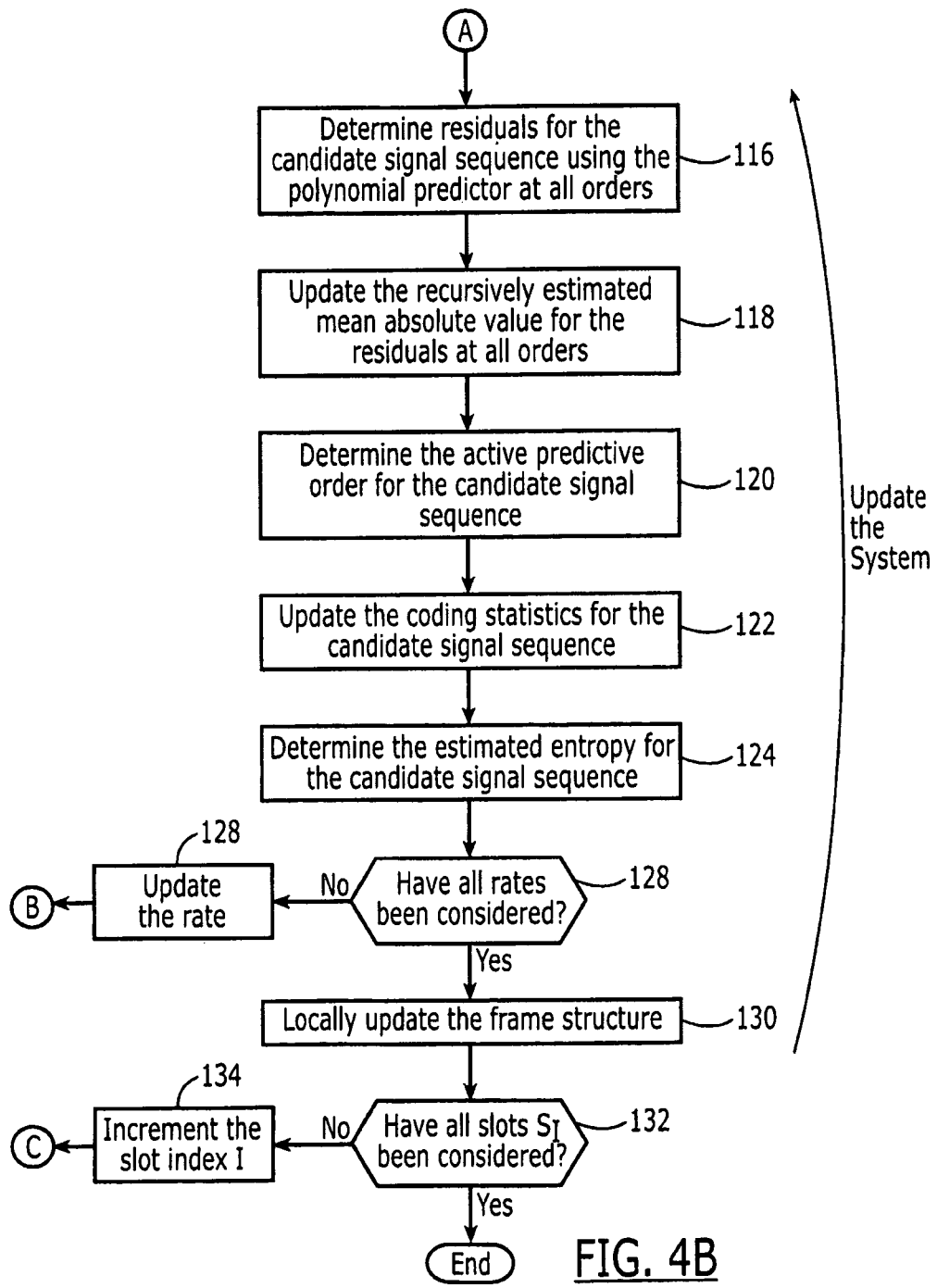
Figure 5:
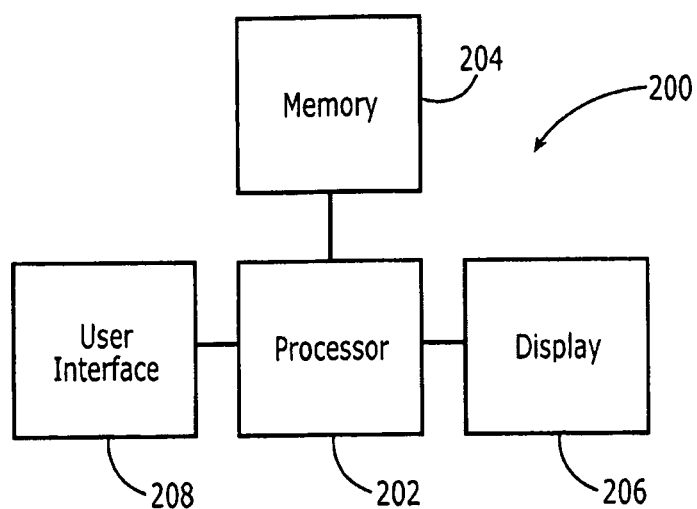

Having thus described the invention in general terms, reference will now be made to the accompanying drawings, which are not necessarily drawn to scale, and wherein:

FIG. 1 is a block diagram of a lossless predictive coder;

FIG. 2 is a block diagram of a predictive coder that relies upon lossy compression;

FIG. 3 is a representative binary tree having a frame size of 4 slots;

FIGS. 4A and 4B are a flow chart illustrating the operations performed by a method and computer program product in accordance with one embodiment of the present invention; and FIG. 5 is a block diagram of an apparatus in accordance with one embodiment of the present invention.

DETAILED DESCRIPTION OF THE INVENTION

The present inventions now will be described more fully hereinafter with reference to the accompanying drawings, in which some, but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

According to one embodiment, a method, apparatus and computer program product are therefore provided for discovering or otherwise determining the frame structure of time multiplexed data without knowledge or any indication of the frame structure being provided. In some instances, the minimum and maximum sample rates are provided, as well as a data constraint that may be relaxed that all of the sample rates are powers of 2, but the frame sequence itself need not be provided to the method, apparatus and computer program product of embodiments of the present invention. With this limited amount of information, the method, apparatus and computer program product can estimate the frame structure by identifying specific signal sequences from among all candidate signal sequences which minimize the expected size of the coded data or minimize the expected rate of the coded data, such as by minimizing the estimated entropy in one embodiment. While the method, apparatus and computer program product of one embodiment are useful in discovering the frame sequence and, in turn, compressing telemetry data, such as the data collected by various sensors, transducers and the like onboard an aircraft, the method, apparatus and computer program product may discover the frame sequence and, in turn, compress a wide variety of time multiplexed data in a wide range of applications. Also, while the method, apparatus and computer program product of one embodiment are useful in discovering the frame sequence and, in turn, compressing telemetry data, other embodiments may compress data for which the frame structure is partially or completely known a priori.

As described below, the time multiplexed data and, in particular, the signals or samples that comprise the time multiplexed data may be decorrelated, such as with a variable order polynomial predictor or other differential coder, e.g., differential pulse code modulation (DPCM) or adaptive DPCM (ADPCM). As also described below, the order of the polynomial predictor may be estimated on the fly to minimize, for example, the estimated entropy of the residual sequence, i.e., the residual. This entropy estimate effectively approximates the cost (in bits per symbol) for encoding the residuals.

While various differential coders can be employed, a polynomial predictor approach will be described for purposes of example, but not of limitation. In this regard, the polynomial predictor approach models the source signals as a series of piecewise segments, each of which can be represented as a polynomial of some specific order. A block diagram for a lossless predictive coder to encode a plurality of source signals, such as time multiplexed data, is shown in FIG. 1. A first order polynomial predictor assumes that the signal is piecewise constant, i.e., that each segment is an order 0 polynomial. In this case, the next sample p is predicted to be the same as the preceding sample x:

$$p_1[n] = x[n-1]$$

A residual r is computed as the difference between the prediction and the actual sample value:

$$r_1[n] = x[n] - p_1[n] = x[n] - x[n-1]$$

In this case, the residual is a first order difference. A second order polynomial predictor assumes that the signal is piecewise linear, with segments that are first order polynomials. For this case, the predictor and residual are given by:

$$p_2[n] = 2x[n-1] - x[n-2]$$

$$\begin{aligned} r_2[n] &= x[n] - p_2[n] \\ &= x[n] - 2x[n-1] + x[n-2] \\ &= (x[n] - x[n-1]) - (x[n-1] - x[n-2]) \\ &= r_1[n] - r_1[n-1] \end{aligned}$$

The residual is seen to be a second order difference, which is itself the difference between two first order differences. In general, the N-th order polynomial predictor assumes the signal consists of segments which are (N−1)-th order polynomials, and is given by:

$$p_N[n] = \sum_{k=1}^{N} (-1)^{k+1} \binom{N}{k} x[n-k]$$

$$\begin{aligned} r_N[n] &= x[n] - p_N[n] \\ &= x[n] - \sum_{k=1}^{N} (-1)^{k+1} \binom{N}{k} x[n-k] \\ &= r_{N-1}[n] - r_{N-1}[n-1] \end{aligned}$$

where the coefficients $$\binom{N}{k}$$

are the binomial coefficients, given by:

$$\binom{N}{k} = \frac{N!}{k!(N-k)!}$$

The residual for an N-th order polynomial predictor is an N-th order difference, which can be expressed as the difference between two (N−1)-th order differences. While the method, apparatus and computer program product can support an arbitrarily large maximum order, typically orders higher than fourth order are not practical. Thus, the method, apparatus and computer program product of one embodiment only determine the residuals for the first through fourth order predictors using the first through fourth order differences of the sequence. As discussed below, the predictor is adapted by choosing the order of the predictor which minimizes the estimated entropy of the residuals. This adaptation of the predictor will include the case of a zeroth order predictor (no prediction), which may result in better coding of noisy sequences or sequences without dependencies.

In the absence of any quantization, this predictive process, when combined with entropy coding of the residuals, results in lossless compression. If the residuals are quantized, the result is lossy compression. The quantization reduces the entropy of the residuals, resulting in higher compression, at the price of distortion in the reconstructed signal.

With lossy compression, the quantization results in differences between the original signal samples in the encoder $x[n]$ and the reconstructed signal samples in the decoder $\hat{x}[n]$.

However, the predictions generated in the encoder and in the decoder should be identical and are advantageously based on exactly the same data, or else the encoder and decoder will diverge. To circumvent this divergence, the method, apparatus and computer program product of one embodiment may generate the reconstructed signal samples x̂[n] within the encoder. This generation is accomplished by introducing a copy of the decoder into the feedback path of the encoder as shown in FIG. 2.

As shown, the residual r[n] is quantized to produce r̂[n]. This quantized residual is passed to a feedback path which duplicates the predictive mechanisms of the decoder. This process guarantees that the prediction p[n] in the encoder and decoder are identical.

An effective predictor will generally produce residuals which are typically small, with a distribution peaked at zero which can be effectively approximated as a Laplacian distribution. A Laplacian distribution is a two-sided exponential with a probability density pdf given by:

$$f_X(x) = 0.5 \lambda e^{-\lambda |x|}$$

The residuals produced by the predictive coding can be modeled by a discrete version of the Laplacian distribution, given by:

$$P(n) = \begin{cases} 1 - p^{0.5} & n = 0 \\ 0.5(1-p)p^{|n|-0.5} & \forall n \neq 0 \end{cases}$$

This discrete distribution is characterized by the decay probability parameter p, and is related to the continuous version by $p = e^{-\lambda}$. The mean absolute value of this distribution is given by:

$$\mu = \sum_{n=-\infty}^{\infty} n P(n)$$
$$= (1-p) \sum_{n=1}^{\infty} n p^{n-0.5}$$
$$= p^{-0.5}(1-p) \sum_{n=1}^{\infty} n p^n = \frac{p^{0.5}}{1-p}$$

$$p = \left( \frac{-1 + sqrt(1 + 4\mu^2)}{2\mu} \right)^2$$

The first order entropy for this distribution is given by:

$$H = -(1 - p^{0.5}) \log_2(1 - p^{0.5}) - $$
$$(1-p)p^{-0.5} \sum_{n \geq 1} p^n \log_2(0.5(1-p)p^{n-0.5})$$
$$= -(1 - p^{0.5}) \log_2(1 - p^{0.5}) - $$
$$p^{0.5} \left[ (\log_2(1-p) - 1) + (\log_2 p)\left( \frac{1}{1-p} - 0.5 \right) \right]$$

Due to the relationship between the mean absolute value and the decay probability, the entropy is monotonic with respect to the mean absolute value. Using this monotonic relationship, the order for the polynomial predictor for the next signal sample may be chosen, as described below, by selecting the predictor order which minimizes the estimated mean absolute value up to the current sample. This selection criteria is equivalent to choosing the predictor order which minimizes the estimated entropy.

As noted above, quantization is applied to residuals of the predictive process, such as by using uniform quantization with a deadzone as known to those skilled in the art. This quantization scheme uses uniform widths for all quantization intervals, except for the quantization interval centered at the origin, which is called the deadzone. The deadzone typically has a larger width than the nominal quantization interval. The unequal size of the deadzone may be done for several reasons: (i) zeroes can be coded very efficiently, so that the rate-distortion performance is usually improved by using a wider deadzone which quantizes more coefficients to zero, (ii) it is preferable when quantizing discrete values to use a deadzone interval with odd width, so that the reconstruction value of zero is directly centered within the deadzone, since deadzones with even width applied to discrete values can result in granular artifacts in the reconstructed signal due to bias from a reconstruction value not centered in the deadzone, and (iii) deadzone quantization allows the use of embedded quantization which is a successive approximation approach to quantization.

A deadzone quantizer may be specified in terms of two parameters: q, the nominal quantization interval, and t, the deadzone threshold. If quantization is being applied to real numbers, then the q and t parameters may also be real numbers. However, in instances in which quantization is being applied to discrete values for the purposes of lossy compression, the quantization interval and threshold may be constrained to be integers.

Any coefficient whose magnitude is less than t is quantized to zero, resulting in a deadzone interval of $q_0 = 2t - 1$, thereby guaranteeing that the deadzone always has an odd width. Thus, with deadzone quantization, a source value x in the original data is replaced with the value x̂ in the reconstructed data, where:

$$\hat{x} = \begin{cases} \left\lfloor q * \left( \left\lfloor \frac{x - t + q}{q} \right\rfloor + 0.5 \right) - 0.5 \right\rfloor + t - q, & \forall x \geq t \\ 0, & \forall |x| < t \\ -\left\lfloor q * \left( \left\lfloor \frac{|x| - t + q}{q} \right\rfloor + 0.5 \right) - 0.5 \right\rfloor - t + q, & \forall x \leq -t \end{cases}$$

where $\lfloor\ \rfloor$ is the floor operator which rounds down to the nearest integer.

In practice, quantization is separated into two stages: quantization in the compressor and dequantization in the decompressor. Quantization represents the source value x with its sign $s_x = \text{sign}(x)$ and a discrete quantization index, both of which are entropy-coded for channel transmission or storage. The quantization index is given by:

$$i_x = \left\lfloor \frac{|x| - t + q}{q} \right\rfloor = \left\lfloor \frac{|x| - t}{q} \right\rfloor + 1$$

Dequantization replaces the decoded sign and quantization index with the reconstructed value x̂:

$$\hat{x} = \begin{cases} q i_x + t - q + \left\lfloor \frac{q-1}{2} \right\rfloor, & \forall i_x > 0 \text{ and } s_x = +1 \\ 0, & \forall i_x = 0 \\ -q i_x - t + q - \left\lfloor \frac{q-1}{2} \right\rfloor, & \forall i_x > 0 \text{ and } s_x = -1 \end{cases}$$

Or more simply:

$$\hat{x} = \begin{cases} qi_x + t - 1 - \left\lfloor \dfrac{q}{2} \right\rfloor, & \forall\, i_x > 0 \text{ and } s_x = +1 \\ 0, & \forall\, i_x = 0 \\ -qi_x - t + 1 + \left\lfloor \dfrac{q}{2} \right\rfloor, & \forall\, i_x > 0 \text{ and } s_x = -1 \end{cases}$$

By way of example, one choice for the deadzone threshold is to set the deadzone threshold equal to the quantization interval (t=q). This choice results in a deadzone interval which is almost twice as large as the nominal quantization interval. This choice may be suitable for use with embedded quantization schemes and because the wider deadzone often improves rate-distortion performance. This approach may also simplify the computation of the quantization index and the reconstructed value as follows:

$$i_x = \left\lfloor \dfrac{|x|}{q} \right\rfloor$$

$$\hat{x} = \begin{cases} qi_x + \left\lfloor \dfrac{q-1}{2} \right\rfloor, & \forall\, i_x > 0 \text{ and } s_x = +1 \\ 0, & \forall\, i_x = 0 \\ -qi_x - \left\lfloor \dfrac{q-1}{2} \right\rfloor, & \forall\, i_x > 0 \text{ and } s_x = -1 \end{cases}$$

As another example, the deadzone threshold may be defined as: $t = 1 + \lfloor q/2 \rfloor$. This choice achieves nearly uniform quantization (including the deadzone) while guaranteeing an odd deadzone width:

$$i_x = \left\lfloor \dfrac{|x| - 1 - \lfloor q/2 \rfloor + q}{q} \right\rfloor = \left\lfloor \dfrac{|x| + \lfloor (q-1)/2 \rfloor}{q} \right\rfloor$$

$$\hat{x} = \begin{cases} q * i_x, & \forall\, i_x > 0 \text{ and } s_x = +1 \\ 0, & \forall\, i_x = 0 \\ -q * i_x, & \forall\, i_x > 0 \text{ and } s_x = -1 \end{cases}$$

When this choice is used in combination with a nominal quantization interval of odd width, then fully uniform quantization is achieved (i.e., $q = q_0 = 2t - 1$). When the nominal quantization interval has even width, then the deadzone interval is one unit wider to maintain the constraint of odd deadzone width.

The residuals may be compressed with an arithmetic coder. For the purposes of this entropy coding, the residual values are separated into zero (insignificant) coefficients and non-zero (significant) coefficients. The significant residuals are further separated into sign and magnitude information. The significance (zero or non-zero condition) of the residuals may be represented using a first-order Markov model. This significance information is then encoded using a binary arithmetic coder. The significant (non-zero) residuals may be separated into sign and magnitude information. The sign information is then encoded using a binary arithmetic coder. To provide further compression, the probability distribution for the coefficient magnitudes may be modeled as an exponential distribution, which can be characterized by a single parameter, the estimated mean of the distribution. Then, based on this exponential model and the estimated mean, the magnitude may be encoded using an exponential arithmetic coder. In one advantageous embodiment, all of the arithmetic-encoded data from all active signal sequences in the time multiplexed data may be multiplexed into a single compressed bit stream, which can be encoded and decoded on the fly.

Entropy coding of the coefficient significance, magnitude, and sign information could be handled with any of a variety of entropy coding methods such as Golomb coding or Huffman coding (in combination with run length coding for the binary sources). However, arithmetic coding may be more efficient for the coding of distributions which are highly skewed toward zero magnitude, encoding at a rate which approaches the estimated entropy. Arithmetic coding may also be more efficient for the encoding of binary sources, which will arise for representation of sign and significance information, as described below. Notably, arithmetic coding facilitates the interleaving of encoded data from multiple sources into a single code stream, which is advantageous for handling the multiple time-multiplexed sequences in telemetry data in which it is generally desired to efficiently encode data when the frame discovery process splits or merges signal sequences, as also described below. Further details regarding arithmetic coding are provided by I. H. Witten, R. M. Neal, and J. G. Cleary, Arithmetic Coding for Data Compression, *Communications of the ACM*, vol. 30, no. 6, pp. 520-540, June, 1987. Moreover, by interleaving the entropy codes from the interleaved signals into an interleaved stream of code bits, the stream may be encoded/decoded continuously, with the interleaved codes for various samples being handled in the same sequence in which those samples occur within the frame structure.

For the purposes of entropy coding, the magnitudes for the significant coefficients may be modeled using a one-sided exponential distribution, given by:

$$P(n) = (1-p)p^{n-1} \;\; \forall n \geq 1$$

This exponential model for the coefficient magnitudes allows the distribution to be characterized by a single parameter, the estimated mean of the distribution, thus simplifying both the modeling of the data and the operation of the arithmetic coder. The arithmetic coder is further modified to effectively handle large coefficient magnitudes without excessively large code words. This is achieved by escaping to a modified coding scheme for which the code word size grows only as the logarithm of the magnitude (rather than in proportion to the magnitude) as the magnitude grows very large.

In the following discussion regarding the interleaving of signal data in the frame structure, a stream, a slot, a rate limit and a signal sequence will be discussed. A stream is a succession of consecutive data samples from the telemetry or data file. These data samples may consist of anything ranging from a mixed structure of interleaved samples from multiple signals sampled at various rates, to a single sequence of samples from just one signal sampled at the highest possible rate. A slot is a sample location within the frame, identified by a unique index. Thus, a frame with $2^K$ slots generally has slots indexed from 0 to $2^K - 1$. For a nominal case, with a word rate of 256 words per second, and a frame rate of once per 64 seconds, the number of slots per frame is $256 * 64 = 16,384 = 2^{14}$ (i.e. K=14). The rate limit is a constraint on the maximum sampling rate for a signal represented within the frame structure, in units of samples per frame, specified as $2^L$ (with $0 \leq L \leq K$). Typically, L<K, so that the maximum sample rate is less than the number of slots in the frame, but this relationship is not essential. For a nominal case, the maximum sample rate is 8 samples per second, or $512 = 2^9$ samples per frame. In instances in which a minimum sample rate is not explicitly specified, the minimum sample rate may be set to a predefined value, such as one sample per frame. Finally, a signal sequence is a succession of data samples associated with one specific signal. These may occur consecutively within the stream or at regular sampling intervals. In one embodiment, the sampling intervals are constrained to be a power of 2, but this constraint may be relaxed in other embodiments. A candidate signal sequence is a sequence of samples within the frame, at an admissible sample rate between the specified minimum and maximum sampling rate, which thus could potentially be used to represent a signal. An active signal sequence is a signal sequence which is actually part of a specified frame structure, or which has been identified as part of an estimated frame structure through a frame discovery process.

When estimating the frame structure, the method, apparatus and computer program product of embodiments of the present invention form hypotheses about the existence of active signal sequences from among the candidate signal sequences within the data stream, based on the statistics of the data. Since the maximum sample rate for a nominal case is 8 samples per second, and the samples are regularly spaced within the stream, the highest rate samples for this nominal case are spaced at intervals of 32 slots within a sub-frame of 256 slots. Conceptually, it may be convenient to think of the data stream as consisting of 32 "virtual streams" interleaved within the data stream. The discovery process could then operate independently on each of these 32 virtual streams. However, the size of the data structures required for treating all of the data as a single stream are generally only negligibly larger than if each of the virtual streams separately and the data may be treated as a single stream if desired. The use of the rate limit (of $2^L=2^9=512$ samples per frame) to constrain the maximum sample rate allows the separation of the 32 virtual streams within the frame structure to be maintained. In one embodiment, therefore, a single data structure is maintained even though a separate frame structure is estimated for each of the 32 interleaved virtual streams.

By way of example, consider a frame consisting of only four slots. For this frame, there are three possible sample rates for the signal sequences: one sample per frame, two samples per frame, and four samples per frame. For notational simplicity, a frame structure will be denoted as a set of active signal sequences. Each signal sequence will be denoted as $(s_1, \ldots, s_{2^R})$, where the $s_i$ terms represent the slots which comprise the signal sequence, and $2^R$ indicates the rate of the signal sequence in units of samples per frame. Also, for purposes of example, but not limitation, sampling intervals are used which are a power of 2. By illustration, consider a frame size of four slots. For this frame size, there are only five possible frame structures: one active signal sequence: $\{(0,1,2,3)\}$, two active signal sequences: $\{(0,2),(1,3)\}$, three active signal sequences: $\{(0),(1,3),(2)\}$, three active signal sequences: $\{(0,2),(1),(3)\}$ and four active signal sequences: $\{(0),(1),(2),(3)\}$ Another way to represent valid frame structures is through the use of binary trees. For the four slot frame size, the binary trees corresponding to the five possible frame structures are shown in FIG. 3.

The number of possible frame structures may grow rapidly with the size of the frame. For the simplest frame, with one slot per frame, there is only one possible frame structure $\{(0)\}$. With two slots per frame, there are two possible frame structures: $\{(0,1,)\}$ and $\{(0),(1)\}$. With four slots per frame, there are five possible frame structures, as described and as shown in FIG. 3. In general, for a frame with $2^K$ slots per frame, the number of possible frame structures is given by:

$$F_{possible}(K)=1+F_{possible}(K-1)^2$$

Thus, for eight slots per frame, there are 26 possible frame structures, and for sixteen slots per frame there are 677 possible frame structures.

For $2^K$ slots per frame with $K \geq 4$, the number of possible frame structures can be approximated by:

$$F_{possible}(K) \approx 677 2^{2^{(K-4)}}$$

By taking the rate limit of $2^L$ into account, the number of possible frame structures is reduced. Specifically, for a given value of K, all structures using a sample rate greater than $2^L$ samples per frame are eliminated, so that the number of possible frame structures becomes:

$$F_{rate-limited}(K,L)=(F_{possible}(K-L))^{2^L}$$

However, even taking the rate limit into account, the number of possible frame structures remains large for a large frame size. For the nominal case, K=14, which results in 16,384 slots and approximately $3.33 \times 10^{2898}$ possible frame structures.

Although the number of possible frame structures may quickly become prodigious, the entropy for all possible frame structures need not generally be estimated. Rather, the method, apparatus and computer program product of one embodiment estimate the frame structure locally and incrementally in an efficient fashion, making only locally optimal decisions about splitting and merging branches within a binary tree representation of the structure, as explained below.

For a frame with $2^K$ slots and a rate limit of $2^L$, there are L+1 theoretically possible rates, ranging from $2^0=1$ sample per frame to $2^L$ samples per frame. As the frame structure is locally estimated, determinations will be repeatedly made decisions about whether a sequence of samples at rate $2^R$ should be treated as one signal sequence (at rate $2^R$) or as two signal sequences (each at rate $2^{R-1}$). At a rate of $2^R$, there are $2^{K-R}$ possible interleaved signal sequences.

Each candidate signal sequence may be denoted concisely using a 2-tuple of the form [R, S], where R specifies a rate of $2^R$ samples per frame and S uniquely specifies one of the $2^{K-R}$ interleaved sequences at that rate. Specifically, S is the index of the first sample of the candidate sequence, which uniquely distinguishes it from all of the other $2^{K-R}$ candidate sequences at rate $2^R$. Each slot $s_I$ within a frame has a unique slot index I within the frame. The sequence [R, S] is thus defined as:

$$[R,S]=(s_I | I=S+i2^{K-R}, \forall i=0 \ldots 2^R-1)$$

The slot index I is uniquely associated with one specific candidate signal sequence at each of the possible L+1 possible rates. Thus, at a rate of $2^R$ samples per frame, the slot $s_I$ is associated with sequence [R,I mod $2^{K-R}$] and occurs at an index of $\lfloor I/2^{K-R} \rfloor$ within the sequence (as repeated once per frame).

The method, apparatus and computer program product of one embodiment may represent the frame structure using a binary tree, with each node of the tree associated with a specific candidate signal sequence occurring at a specific rate. The state of the binary tree may either be entirely prescribed (in accordance with a known frame structure) such as during the compression of time-multiplexed data without the use of the frame discovery mechanisms, entirely estimated on the fly (based on correlations between samples in the data stream detected as part of a frame discovery process), or partially prescribed and partially estimated (when the frame structure is partially known, such as the location of sync words, or frame count words).

Although various state values may be employed, the tree nodes may take on the following state values in accordance with one embodiment of the present invention to indicate the frame structure:

n<−5: Unused state value.

n=−5: Vacant node based on frame discovery. All descendants of a leaf node detected by the frame discovery process are automatically designated as vacant nodes.

n=−4: Branch node based on frame discovery. All ancestors of a leaf node detected by the frame discovery process, which are not also ancestors of a prescribed leaf node, are automatically designated as branch nodes.

n=−3: Leaf node based on frame discovery. A leaf node is associated with a currently active signal sequence. The leaf node is selected to minimize a local estimate of entropy within the binary tree.

n=−2: Prescribed vacant node. All descendants of a prescribed leaf node are automatically prescribed to be vacant nodes.

n=−1: Prescribed branch node. All ancestors of a prescribed leaf node are automatically prescribed to be branch nodes.

n=0: Prescribed leaf node using the globally specified quantization interval. The global quantization interval will normally be equal to 1, resulting in lossless compression. A prescribed leaf node is associated with an active signal sequence which has been prescribed in accordance with a partly or completely known frame structure.

n>0: Prescribed leaf node using a specified quantization interval equal to n. This allows specific known signals to be quantized using an individually specified quantization interval, for selective use of lossy compression. The prescribed leaf node is associated with an active signal sequence, which has been prescribed in accordance with a partly or completely known frame structure.

The leaves of the tree indicate which sequences among all candidate signal sequences are active sequences. The root node of the tree is associated with a signal sequence at the theoretically maximum possible rate (of $2^K$ samples per frame), in which all of the samples in the frame are part of only one signal. In practice, the constraint imposed by the rate limit may mean that this is not an admissible rate. The extreme nodes of the tree are associated with fully interleaved signal sequences sampled at the minimum rate, in which each sample in the frame belongs to a distinct signal sequence. Since entropy is an additive measure (representing a lower bound on the number of bits required for encoding), the entropy for a particular choice of frame structure may be estimated as the sum of the estimated entropies of the active signal sequences (or leaf nodes). Thus, a frame structure may be selected based upon the sum of the entropies of the active signal sequences, such as by using a minimum entropy algorithm, similar to the "best basis" algorithms used in adaptive signal decompositions.

By way of example, a greedy algorithm may be employed to make locally optimal decisions within the frame tree structure, leading to a globally optimal structure. Each decision is rendered at a single branch of the tree structure and determines whether a specific set of samples at rate R is treated as a one signal sequence (at rate R) or split into two signal sequences (each at rate R/2). The decision is rendered to choose the representation which minimizes the estimated local measure of entropy. The entropy estimates are derived from the statistics for the entropy coding of the candidate signal sequences, as described below.

To support the coordinated operation of the adaptive polynomial predictors, the entropy coding, and the discovery of frame structure, the method, apparatus and computer program product of one embodiment monitor the statistical structure of the data, typically on three levels. Note that these statistics are typically maintained by both the compressor and decompressor. Synchronized operation between the compressor and decompressor is possible because these statistics are generated in a causal manner and are maintained in an identical state in both the compressor and decompressor.

At the first level, the method, apparatus and computer program product of one embodiment maintain the statistics for the polynomial predictors of order 0 to N (nominally 4) for every possible signal sequence in the data stream. These statistics consist of the current residual value and the current estimated mean absolute value for the residual at each order of the predictor (from level 0 to 4). The mean absolute value for the residual sequence for each order of the predictor may be estimated recursively by:

$$\mu=[n] f_{Pred}\mu[n-1]+(1-f_{Pred})r[n]$$

where $f_{Pred}$ is the forgetting factor for predictor magnitudes and r[n] is the current residual value (for a given order of the predictor).

With a Laplacian model for the residual coefficients, the estimated first order entropy for the residual coefficients is monotonic with respect to the mean absolute value. Thus, the predictor order which minimizes the entropy of the predictor can be selected by choosing the predictor order with the minimum estimated mean absolute value for the predictor residuals up to the previous sample in the sequence. In the case of equal mean absolute values, the lower order predictor may be chosen.

Both the residual values and the mean absolute values of the residuals are generally initialized to zero. This guarantees that all of the predictors will start operation at order 0, and change to higher order as appropriate for the correlation structure of the corresponding signal sequences.

At the second level, for every candidate signal sequence in the data stream, the method, apparatus and computer program product maintain statistics for entropy coding of the residual coefficients. These statistics are directly utilized by the arithmetic coder.

At first glance, it might seem that entropy coding statistics need only be maintained for active signal sequences. However, as the frame structure of the data stream is discovered, new active sequences may be designated on the fly, and the entropy coding statistics for these newly active sequences are advantageously immediately available for proper operation of the arithmetic coder. Additionally, the entropy coding statistics may be utilized as part of the frame discovery process as described below. Both of these factors suggest that coding statistics be maintained for all candidate sequences in one embodiment.

For the purposes of entropy coding, the residual values are separated into zero (insignificant) coefficients and non-zero (significant) coefficients. The significant residuals are further separated into sign and magnitude information.

As described above, the significance (zero or non-zero condition) of the residual coefficients may be represented using a first-order Markov model, with the probability of significance for a given coefficient conditioned on the significance of the prior coefficient in the sequence. The unconditional probability of significance is given by P(S)=1−P(I). The first-order Markov model is then given by:

$$P(S)=P(S|S)P(S)+P(S|I)P(I) \quad P(I)=P(I|S)P(S)+P(I|I)P(I)$$

Solving for the base probabilities in terms of the conditional probabilities (which will be directly estimated), the following is obtained:

$$P(S) = \frac{P(S \mid I)}{P(S \mid I) + P(I \mid S)}$$
$$P(I) = \frac{P(S \mid I)}{P(S \mid I) + P(I \mid S)}$$

The conditioned significance information may be treated as a binary source with value 1 representing no change in significance and 0 representing a change in significance. These conditioned probabilities are represented in terms the mean of the conditioned binary values, recursively estimated with a user-selectable forgetting factor. Thus, given a sequence of residual samples r̂[n] (possibly quantized), P(I|S)=1−P(S|S) and:

$$P(S \mid S) \cong \mu_{StaySig}[n]$$

$$= \begin{cases} \mu_{StaySig}[n-1], & \forall \hat{r}[n-1] = 0 \\ f_{Significance}\mu_{StaySig}[n-1] + \\ \quad 1 - f_{Significance}, & \forall \hat{r}[n-1] \neq 0, \hat{r}[n] \neq 0 \\ f_{Significance}\mu_{StaySig}[n-1], & \forall \hat{r}[n-1] \neq 0, \hat{r}[n] = 0 \end{cases}$$

where $f_{Significance}$ is the forgetting factor for estimating significance means and $\mu_{StaySig}[n]$ is the estimated mean for the probability of "staying significant". Similarly, P(S|I)=1−P(I|I) and:

$$P(I \mid I) \cong \mu_{StayInsig}[n]$$

$$= \begin{cases} \mu_{StayInsig}[n-1], & \forall \hat{r}[n-1] \neq 0 \\ f_{Significance}\mu_{StayInsig}[n-1] + \\ \quad 1 - f_{Significance}, & \forall \hat{r}[n-1] = 0, \hat{r}[n] = 0 \\ f_{Significance}\mu_{StayInsig}[n-1], & \forall \hat{r}[n-1] = 0, \hat{r}[n] \neq 0 \end{cases}$$

where $\mu_{StayInsig}[n]$ is the estimated mean for the probability of "staying insignificant".

The estimated mean values may be constrained by bounds, such as user-selectable bounds, to limit the cost of coding an improbable significance condition, and to preclude underflow in the arithmetic coder. During initialization, the mean values (for both the prior coefficient significant and prior coefficient insignificant conditions) may be set to 0.5 in one embodiment. By default, it is also generally assumed that the coefficient prior to the first coefficient in any sequence is significant (i.e., r̂[−1]≠0).

The signs for significant coefficients may be treated as a binary source with value 1 representing a negative coefficient and 0 representing a positive coefficient. The probability for this source may be represented as the mean of the binary value, recursively estimated with a user-selectable forgetting factor. Thus, P(+)=1−P(−) and:

$$P(-) \cong \mu_{Sign}[n]$$

$$= \begin{cases} \mu_{Sign}[n-1], & \forall \hat{r}[n] = 0 \\ f_{Sign}\mu_{Sign}[n-1] + 1 - f_{Sign}, & \forall \hat{r}[n] < 0 \\ f_{Sign}\mu_{Sign}[n-1], & \forall \hat{r}[n] > 0 \end{cases}$$

where $f_{Sign}$ is the forgetting factor for estimating significance probabilities and $\mu_{Sign}[n]$ is the estimated mean for the probability of a minus sign.

The estimated mean value may be constrained by bounds, such as user-selectable bounds, to limit the cost of coding an improbable sign value, and to preclude underflow in the arithmetic coder. During initialization, the mean value may be set to 0.5 in one embodiment.

The magnitudes for significant coefficients may be modeled as an exponentially distributed source, which may be characterized by a single parameter, the mean of the distribution. The mean may be estimated recursively with user-selectable forgetting factor. Thus:

$$\mu_{Mag}[n] = \begin{cases} \mu_{Mag}[n-1], & \forall \hat{r}[n] = 0 \\ f_{Mag}\mu_{Mag}[n-1] + (1-f_{Mag})|\hat{r}[n]|, & \forall \hat{r}[n] \neq 0 \end{cases}$$

where $\mu_{Mag}[n]$ is the estimated mean of the coefficient magnitudes and $f_{Mag}$ is the forgetting factor for estimating this mean.

The estimated mean value may be constrained by a bound, such as a user-selectable lower-bound, to limit the cost of coding an improbably large coefficient magnitude, and to preclude underflow in the arithmetic coder. In one embodiment, the estimated mean magnitude value may be initialized to an arbitrary value, such as about 2.618.

At the third level, the method, apparatus and computer program product of one embodiment maintain entropy estimates for all candidate signal sequences, to be used in determining the frame structure which minimizes the overall estimated entropy. The entropy estimates for the candidate signal sequences are derived from the coding statistics described above. Specifically, the method, apparatus and computer program product of one embodiment estimate the entropy for encoding the significance, sign, and magnitude information of the residual coefficients for each candidate signal sequence. Although various units may be employed, these entropies may be estimated in units of nats, using the natural logarithm ln( ) rather than $\log_2( )$ for the sake of computational efficiency. A nat is equivalent to $\log_2(e) \cong 1.443$ bits.

As described previously, the significance (zero or non-zero condition) of the residuals may be represented using a first-order Markov model, with the probability of significance of a residual conditioned on the significance of the previous residual in the sequence. The estimated entropy (in nats per sample) for this significance information is given by:

$$\begin{aligned}H_{Significance} &= -P(I)[P(S \mid I)\ln(P(S \mid I)) + P(I \mid I)\ln(P(I \mid I))] - \\ &\quad P(S)[P(S \mid S)\ln(P(S \mid S)) + P(I \mid S)\ln(P(I \mid S))] \\ &= -\frac{P(I \mid S)[P(S \mid I)\ln(P(S \mid I)) + P(I \mid I)\ln(P(I \mid I))]}{P(S \mid I) + P(I \mid S)} - \\ &\quad \frac{P(S \mid I)[P(S \mid S)\ln(P(S \mid S)) + P(I \mid S)\ln(P(I \mid S))]}{P(S \mid I) + P(I \mid S)} \\ &= -\frac{(1-\mu_{StaySig})\begin{bmatrix}(1-\mu_{StayInsig})\ln((1-\mu_{StayInsig})) + \\ \mu_{StayInsig}\ln(\mu_{StayInsig})\end{bmatrix}}{2 - \mu_{StaySig} - \mu_{StayInsig}} - \\ &\quad \frac{(1-\mu_{StayInsig})\begin{bmatrix}\mu_{StaySig}\ln(\mu_{StaySig}) + \\ (1-\mu_{StaySig})\ln(1-\mu_{StaySig})\end{bmatrix}}{2 - \mu_{StaySig} - \mu_{StayInsig}}\end{aligned}$$

The sign for the significant residuals may be modeled as a binary source, with probabilities given by P(+)=1−P(−). The estimated entropy (in nats per sample) for this sign information is given by:

$$H_{Sign} = -P(S)[P(+)\ln(P(+)) + P(-)\ln(P(-))]$$

$$= -\frac{(1-\mu_{StayInsig})[(1-\mu_{Sign})\ln(1-\mu_{Sign}) + \mu_{Sign}\ln(\mu_{Sign})]}{2 - \mu_{StaySig} - \mu_{StayInsig}}$$

The magnitudes of the significant coefficients may be modeled as an exponentially distributed source with a distribution given by:

$$P(n) = (1-p)p^{n-1} \, \forall n \leq 1$$

This exponential model for the coefficient magnitudes allows the distribution to be completely characterized by a single parameter, the estimated mean of the distribution, which may be given by:

$$\mu_{Exp} = E[n] = (1-p)\sum_{n=1}^{\infty} np^{n-1} = \frac{1}{1-p} \Rightarrow p = \frac{\mu_{Exp}-1}{\mu_{Exp}}$$

The first order entropy (in bits per symbol) for an exponential distribution may be given by:

$$H = -(1-p)\sum_{n=1}^{\infty}[p^{n-1}\log_2((1-p)p^{n-1})]$$

$$= -(1-p)\left[\log_2(1-p)\sum_{n=1}^{\infty}p^{n-1} + \log_2(p)\sum_{n=1}^{\infty}(p^{n-1}(n-1))\right]$$

$$= -\log_2(1-p) - \frac{p\log_2 p}{1-p}$$

$$= \mu_{Exp}\log_2(\mu_{Exp}) - (\mu_{Exp}-1)\log_2(\mu_{Exp}-1)$$

Thus, the estimated entropy (in nats per sample) for the coefficient magnitudes:

$$H_{Mag} = P(S)(\mu_{Mag}\ln(\mu_{Mag}) - (\mu_{Mag}-1)\ln(\mu_{Mag}-1))$$

$$= \frac{(1-\mu_{StayInsig})[\mu_{Mag}\ln(\mu_{Mag}) - (\mu_{Mag}-1)\ln(\mu_{Mag}-1)]}{2 - \mu_{StaySig} - \mu_{StayInsig}}$$

The overall estimated entropy for a signal sequence is simply the sum of the entropies for the significance, sign, and magnitude information:

$$H_{seq} = H_{significance} + H_{Sign} + H_{Mag}$$

While the estimated entropy for a signal sequence can be computed as set forth above, the estimated entropy can be computed or estimated in other manners without departing from the spirit and scope of the present invention. For example, the entropy of the residuals can be estimated directly based upon the mean absolute value of the residuals.

For each candidate sequence, the entropy estimate may be smoothed, such as by using a user-selectable forgetting factor, in order to limit disruptive effects of transient data as follows:

$$H_{Disc}[n] = f_{Disc}H_{Disc}[n-1] + (1-f_{Disc})H_{Seq}[n]$$

where $f_{Disc}$ is the forgetting factor for smoothing of entropy estimates and $H_{Disc}[n]$ is the smoothed entropy estimate for a particular signal sequence, to be used in making decisions about splitting and merging signal sequences in the discovery process.

As each slot of the frame is processed by the method, apparatus and computer program product of one embodiment, the entropy is estimated for all candidate signal sequences of which the slot belongs (one sequence for each of the L+1 admissible sampling rates). Then, a local decision is rendered within the context of the binary tree representing the current frame structure, whether to modify the active signal sequence to which the current slot belongs. In one embodiment, the three options for modification are: (i) split the active sequence into two lower rate active sequences (e.g., split the sequence (0,2) into (0) and (2) in the second binary tree from the left in FIG. 3), (ii) merge the sequence with a sibling sequence to form one higher rate active sequence (e.g., merge the sequences (0, 2) and (1, 3) in the second binary tree from the left in FIG. 3 into the sequence (0, 1, 2, 3)), or (iii) retain the currently active sequence. This decision is rendered to achieve minimum entropy summed over the sequences under consideration.

While the smoothing factor may be according to the rate of the sequences to cause the smoothing to operate over equivalent time intervals for sequences sampled at different rates, the same smoothing factor is generally used to smooth at all rates so as to cause the smoothing to operate over an equivalent number of samples at all rates.

Prior to actual processing of samples, the state of the compressor and the decompressor is generally initialized. This initialization involves initializing the state of all of the predictor, coding, and discovery statistics as described above. It also generally involves initializing the binary tree to represent an initial state for the frame structure. Except for leaf nodes which are prescribed for any known frame structure, the tree may be initialized to operate at the highest admissible rates.

Each sample within the frame is associated with a candidate signal sequence at each of the admissible rates, but is associated with only one active signal sequence (at any given time). This association to an active sequence is determined based on the present state of the binary tree representing the frame structure. However, as explained above, it is advantageous to maintain predictor, coding, and discovery statistics for all candidate signal sequences, not just the active signal sequences, so that the determination of which sequences are active may be readily changed as part of the discovery process.

For purposes of illustration, the sample processing performed by the method, apparatus and computer program product of one embodiment is described primarily from the perspective of the compressor. However, analogous operations take place in the decompressor in order to maintain synchronization of the entire decorrelation, quantization, coding, and frame discovery process with the compressor.

In order to process a sample in accordance with one embodiment of the method, apparatus and computer program product, a sample for slot $s_l$ is read as shown in block 100 of FIG. 4A. Initially, the sample is encoded. In this regard, the active rate for slot $s_l$ is also determined based on the present state of the binary tree and related data structures, as shown in block 102. While the active rate may simply be predefined during the processing of the first sample, the active rate is generally determined during the processing of the immediately preceding sample, as will be noted below. This rate also provides a designation of one specific active signal sequence that includes the current sample. As shown in block 104, the state for the active signal sequence is then loaded, such as from memory. As described above, the state of an active signal sequence may include the current state of the polynomial predictor, the entropy coder, and the discovery process.

As shown in block 106, the residual for the polynomial predictor is computed up to the currently active order of the predictor. If the currently active order is order 2, for example, the residual may be separately determined for the polynomial predictor of order 0, of order 1 and of order 2. While the active order may simply be predefined during the processing of the first sample, the active order is generally determined during the processing of the preceding sample within the active signal sequence, as will be noted below. As also described above and known to those skilled in the art, the residual is quantized in accordance with the currently active quantization settings. See block 108. The quantized residual coefficient is then encoded at block 110. This encoding generally involves the encoding of the significance of the coefficient, as well as the sign and magnitude for significant coefficients.

Following this encoding process, the statistical model for the system is updated, such as by updating the current state of the polynomial predictor, the entropy coder and the discovery process. In this regard, the polynomial predictor may be generally operated in reverse sequence to recover a quantized representation of the sample value. See block 112. This prevents divergence between the compressor and decompressor. Alternatively, the quantized representation of the sample value may be recovered by simply computing the error due to quantization of the residual (by subtracting the unquantized value of the residual from the quantized value), and adding that error to the original sample value.

Utilizing the recovered quantized representation of the sample value and for a respective one of the admissible rates, the candidate signal sequence associated with slot $s_I$ at the respective rate is determined as shown in block 114. In other words, a determination is made as to which node includes slot $s_I$ at the respective rate. In this regard, it is noted that the node is a leaf node only if the candidate signal sequence is the active signal sequence. However, this process will loop through and, therefore, consider all of the admissible rates, and at each rate consider the candidate signal sequence for which slot $s_I$ is a member. For a given rate, all of the nodes are at the same depth in the tree. Thus as the admissible rates are considered, a sequence of nodes in the tree are navigated through which correspond to the candidate signal sequences for slot $s_I$, either moving downwards toward the root node or upwards away from the root node. Following the determination shown in block 114, the residuals for the candidate signal sequence are determined using the polynomial predictor at all orders, e.g., from 0 to 4, based on the recovered quantized representation of the sample value obtained above. See block 116. For the candidate signal sequence, the recursively estimated mean absolute value for the residual is updated at all orders as described above and as shown in block 118. The active predictive order for the candidate signal sequence (to be used on the next sample in this sequence) may then be determined by choosing the order of the polynomial predictor having the residual with the minimum estimated mean absolute value (which also minimizes the estimated entropy). See block 120.

The coding statistics for the candidate signal sequence, i.e., the statistics relating coefficient significance, signs for significant coefficients and magnitudes for significant coefficients are then updated as described above and as shown in block 122. The estimated entropy for the candidate signal sequence is then determined as also described above. See block 124. As shown in FIGS. 4A and 4B, the operations represented by blocks 114-124 are then repeated for each admissible rate. See blocks 126 and 128.

Thereafter, the estimated frame structure is locally updated. See block 130. Specifically, for the active signal sequence associated with slot $s_I$, the estimated entropies for the parent, sibling, and child nodes of the active signal sequence are considered to select one of three actions: (a) split the active sequence into two lower rate active sequences, (b) merge the sequence with a sibling sequence to form one higher rate active sequence, or (c) retain the currently active sequence. In one embodiment, the merger with a sibling sequence is considered only when the sibling is an active sequence, i.e., only when the sibling sequence is presently associated with a leaf node, so as to insure that the binary tree is only changed in a gradual manner. This selection is typically made to achieve minimum estimated entropy summed over the active signal sequences. Not only does the selection locally update the estimated frame structure, but the selection also defines the active rate that will be employed in conjunction with the next sample, i.e., the active rate is the rate of the two lower rate active sequences in (a), the rate of the higher rate active sequence in (b) and the rate of the currently active sequence in (c).

If all slots have not been processed, the slot index I is incremented and masked to limit it to the range of 0 to $2^K-1$. See blocks 132 and 134. The operations set forth in FIGS. 4A and 4B by blocks 100-132 are then repeated until all of the samples have been processed. Once all the samples in a frame have been processed, the operations need not end as shown in FIGS. 4A and 4B. Instead, operations directed to processing the samples of the next frame may be commenced. This processing of frame after frame may be continued until all of the data in the stream has been processed, even in the end of the stream is reached in the middle of a frame.

As the individual samples are processed, the method, apparatus and computer program product of one embodiment may output, e.g., transmit, store, etc., the arithmetic-coded data from all of the samples as a single compressed bit stream. In one embodiment, the stream of arithmetic-coded data is preceded in the compressed file by a header which may convey information such as the size of the compressed file, the frame size, the rate limit, the sample depth (in bits per pixel), the quantization settings, and the entropy coding method. The decompressor can recover all of the samples by processing the arithmetic-coded data, maintaining synchronization with the coding process of the compressor.

The compression process typically starts with an initialized state for the binary tree structure, which may be incorrect, i.e., not matching the true frame structure. This binary tree representation of the frame structure will typically evolve towards the correct frame structure as more data is processed. However, the compression will perform correctly whether or not the tree structure is correct. Nevertheless, compression will typically become more efficient as the tree structure more closely matches the true frame structure of the data. Also, the performance of the polynomial predictors and entropy coders will generally improve as their statistics change from their initial conditions to more accurate estimates of the statistics of the underlying data.

While certain embodiments of a method, apparatus and computer program has been described above, the method, apparatus and computer program product can be extended to many other embodiments without departing from the spirit and scope of the present invention. In this regard, while the frame structure was represented in the foregoing embodiment as a binary tree, the frame structure may be represented as a non-binary tree in accordance with other embodiments. Additionally, the speed with which the frame sequence is discovered may be increased in various manners including, for example, updating the estimates on a frame basis, as opposed to the sample basis described above, constraining the search for possible frame structures in any one of various manners, and/or estimating the entropies of the various signal sequences and their residuals rather than calculating or otherwise determining the actual entropies. For example, entropy can be estimated by approximating the entropy of a candidate signal sequence and its residual based directly on the mean absolute value which is monotonically related to the entropy. In order to further conserve processing resources, once the estimation of a frame sequence has stabilized, the estimation process can be halted or at least paused for re-execution at predefined intervals, such as once for every sixteen frames.

As shown in FIG. 5, the apparatus 200 of embodiments of the present invention is typically embodied by a processing element 202 and an associated memory device 204, both of which are commonly comprised by a computer or the like. In this regard, the method of embodiments of the present invention as set forth generally in FIGS. 4A and 4B can be performed by the processing element executing a computer program instructions stored by the memory device. The memory device may also store the time-multiplexed data as well and/or the compressed representation of the time multiplexed data. The computer can include a display 206 for presenting information and/or a user interface 208 for receiving information relative to performing embodiments of the method of the present invention.

According to one aspect of the present invention, the apparatus of embodiments of the present invention generally operates under control of a computer program product according to another aspect of the present invention. The computer program product for performing the methods of embodiments of the present invention includes a computer-readable storage medium, such as the non-volatile storage medium, and computer-readable program code portions, such as a series of computer instructions, embodied in the computer-readable storage medium.

In this regard, FIGS. 4A and 4B are a flowchart of methods, systems and program products according to exemplary embodiments of the present invention. It will be understood that each block or step of the flowchart, and combinations of blocks in the flowchart, can be implemented by computer program instructions. These computer program instructions may be loaded onto a computer or other programmable apparatus to produce a machine, such that the instructions which execute on the computer or other programmable apparatus create means for implementing the functions specified in the flowchart block(s) or step(s). These computer program instructions may also be stored in a computer-readable memory that can direct a computer or other programmable apparatus to function in a particular manner, such that the instructions stored in the computer-readable memory produce an article of manufacture including instruction means which implement the function specified in the flowchart block(s) or step(s). The computer program instructions may also be loaded onto a computer or other programmable apparatus to cause a series of operational steps to be performed on the computer or other programmable apparatus to produce a computer implemented process such that the instructions which execute on the computer or other programmable apparatus provide steps for implementing the functions specified in the flowchart block(s) or step(s).

Accordingly, blocks or steps of the flowchart support combinations of means for performing the specified functions, combinations of steps for performing the specified functions and program instruction means for performing the specified functions. It will also be understood that each block or step of the flowchart, and combinations of blocks or steps in the flowchart, can be implemented by special purpose hardware-based computer systems which perform the specified functions or steps, or combinations of special purpose hardware and computer instructions.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed is:

1. A method for estimating a frame structure of multiplexed data comprising a plurality of samples, the method comprising:
representing a state of an estimated frame structure of multiplexed data with a tree structure;
receiving a sample;
following receipt of each sample, determining, via a processor, a plurality of candidate signal sequences that are at least partially based upon the tree structure and which include the respective sample, said candidate signal sequences only occurring at each of one or more admissible sample rates, said sample rates being associated with a rate of samples of a signal prior to encoding;
estimating an expected bit rate for coding of each candidate signal sequence; and
determining an active signal sequence that includes the respective sample from among the candidate signal sequences based upon an estimated measure of performance, wherein determining the active signal sequence comprises selecting a set of active signal sequences from among the candidate signal sequences which minimizes a sum of the estimates of the expected bit rates for the candidate signal sequences that comprise the active signal sequences.

2. A method according to claim 1 wherein estimating the expected bit rate for the coding of a candidate signal sequence comprises determining a residual for the candidate signal sequence and estimating an entropy for the residual.

3. A method according to claim 2 wherein determining the residual of a candidate signal sequence comprises:
generating a prediction of a sample value; and
computing the residual as the difference between an actual sample value and the predicted sample value.

4. A method according to claim 3 wherein the actual sample value is selected from the group consisting of a received sample value or a reconstructed sample value.

5. A method according to claim 4 wherein determining the residual for a candidate signal sequence comprises determining the residual for a polynomial predictor.

6. A method according to claim 5 wherein the polynomial predictor is operable at a plurality of orders, each order relating to the order of the polynomial used to generate the prediction, and wherein the method further comprises selecting one order from the plurality of orders based on a measure of predictor performance.

7. A method according to claim 6 wherein selecting the order for a polynomial predictor comprises:
determining the residual for polynomial predictors operating at each of the plurality of orders;

estimating the entropy for the residual for each of the plurality of orders;

selecting the order from among the plurality of orders which has a minimum estimated entropy.

8. A method according to claim 7 wherein estimating the entropy for a residual comprises modeling residual values using a Laplacian distribution, and estimating the entropy of the distribution using an estimated mean absolute value for the residual.

9. A method according to claim 8 wherein selecting the order comprises selecting the order having the smallest estimated mean absolute value for the residual.

10. A method according to claim 1 further comprising repeating the steps of receiving a sample, determining candidate signal sequences and determining an active signal sequence for each sample among a plurality of samples which comprise a frame.

11. A method according to claim 1 wherein the steps of receiving a sample, determining candidate signal sequences and determining an active signal sequence are performed at the end of each frame, after all of the samples in the frame have been received.

12. A method according to claim 1 wherein:
each node of the tree structure is associated with a candidate signal sequence within the multiplexed data;
a level within the tree structure at which a node is located determines the rate at which the corresponding signal sequence is sampled, with higher sample rates associated with the lower levels of the tree that are closer to the root node and lower sample rates associated with the higher levels of the tree structure;
the root node of the tree structure is associated with a candidate signal sequence comprising every sample within the frame structure, sampled at the full rate of the data;
each node in the tree structure except for the node(s) at the highest level of the tree structure, furthest from the root node branches to N child nodes;
the N child nodes of a parent node are associated with N signal sequences interleaved at equal sample spacing whose samples collectively comprise the samples of the signal sequence associated with the parent node.

13. A method according to claim 12 wherein the active signal sequences are associated with leaf nodes such that:
all descendent nodes of any leaf node are deemed as inactive nodes; and
all ancestor nodes of any leaf node are deemed as branch nodes.

14. A method according to claim 13 further comprising updating the estimated frame structure for the time-multiplexed data as represented by changes in designation of which nodes are leaf nodes, which nodes are inactive nodes, and which nodes are branch nodes.

15. A method according to claim 14 wherein the frame structure is partially known a priori, such that certain signal sequences within the time-multiplexed data are designated as permanently active signal sequences, having a representation with the estimated tree structure as follows:
the nodes associated with the permanently active signal sequences are designated as permanent leaf nodes, which may not be changed by the method of estimating the frame structure;
all descendent nodes of a permanent leaf node are designated as permanent inactive nodes, which may not be changed by the method of estimating the frame structure; and
all ancestor nodes of a permanent leaf node are designated as permanent branch nodes, which may not be changed by the method of estimating the frame structure.

16. A method estimating a frame structure of time-multiplexed data comprising a plurality of samples, the method comprising:
receiving a sample;
determining, via a processor, candidate signal sequences which include the sample, said candidate signal sequences occurring at each of one or more admissible sample rates;
determining an active signal sequence from among the candidate signal sequences based upon an estimated measure of performance;
estimating an expected bit rate for coding of each candidate signal sequence which includes a current sample;
determining which of the candidate signal sequences for the current sample is currently the active signal sequence based on a current estimate of the frame structure determined from prior samples;
estimating the expected bit rate for the coding of signal sequences associated with each option of splitting, merging, or retaining the currently active signal sequence; and
selecting from among the options of splitting, merging, or retaining the currently active signal sequence that option which minimizes the expected bit rate.

17. A method according to claim 16 wherein estimating the expected bit rate for the coding of the signal sequences associated with the options of splitting, merging, or retaining the currently active signal sequence includes, for each of these options, estimating the expected bit rate for the coding of the samples associated with the currently active signal sequence and the coding of the samples from N sibling signal sequences which under the merging option would be merged with the currently active signal sequence, so that for each option estimating of the expected bit rate is considered for an identical set of samples, wherein N is an integer of 2 or greater.

18. A method according to claim 16 wherein splitting the currently active signal sequence comprises splitting the samples of the currently active signal sequence to form N active signal sequences, interleaved with each other at equal sample spacing and with each operating at a sample rate which is one-Nth of the sample rate for the currently active signal sequence, wherein N is an integer of 2 or greater.

19. A method according to claim 16 wherein merging the currently active signal sequence comprises merging the samples from the currently active signal sequence with the samples from N sibling signal sequences interleaved with each other at equal sample spacing to form a new active signal sequence operating at a sample rate which is N times the sample rate of the currently active signal sequence, wherein N may be an integer of 2 or greater.

20. A method according to claim 19 wherein merging the currently active signal sequence with samples from the N sibling signal sequences requires all of the sibling signal sequences to be active signal sequences.

21. A method for estimating a frame structure of time-multiplexed data comprising a plurality of samples, the method comprising:
receiving a sample;
determining, via a processor, candidate signal sequences which include the sample, said candidate signal sequences occurring at each of one or more admissible sample rates; and determining an active signal sequence from among the candidate signal sequences based upon an estimated measure of performance, wherein the frame structure is partially known a priori, such that certain signal sequences within the time-multiplexed data are designated as permanently active signal sequences, and wherein the permanently active signal sequences and the samples which comprise the permanently active signal sequences are excluded from the method of estimating the frame structure.

22. A method for compressing a sequence of multiplexed data comprising a plurality of samples, the method comprising:

representing a state of an estimated frame structure of the multiplexed data with a tree structure in which each node is associated with a candidate signal sequence from the multiplexed data;

receiving a current sample;

estimating an expected bit rate for coding of each candidate signal sequence;

determining an active signal sequence which includes the current sample by selecting a set of active signal sequences from among the candidate signal sequences which minimizes a sum of the estimates of the expected bit rates for the candidate signal sequences that comprise the active signal sequences;

following receipt of each current sample, determining, via a processor, an active sample rate that includes the current sample from among the candidate signal sequences for the current sample and the corresponding active signal sequence, which is operating at the active sample rate, said sample rate being associated with a rate of samples of a signal prior to encoding; and encoding the current sample as a member of the corresponding active signal sequence.

23. A method according to claim 22 wherein encoding the current sample as a member of the corresponding active signal sequence comprises:

determining a predicted sample value based on preceding samples in the active signal sequence and a model for the signal;

computing a residual as the difference between an actual sample value and the predicted sample value; and encoding the residual using entropy coding.

24. A method according to claim 23 wherein the entropy coding includes arithmetic coding employed in such a manner that encoded data from all active signal sequences is multiplexed into a single compressed bit stream.

25. A method according to claim 23 wherein determining the predicted sample value uses differential pulse code modulation.

26. A method according to claim 23 wherein determining the predicted sample value uses adaptive differential pulse code modulation, such that predictor coefficients are estimated based on the preceding samples to minimize the mean squared values of the residuals.

27. A method according to claim 23 wherein determining the predicted sample value uses a polynomial predictor computed up to an active order of the polynomial predictor, with said polynomial predictor modeling signal segments as polynomials.

28. A method according to claim 27 wherein the order of the polynomial predictor is selected from among a plurality of orders, such that the selected order minimizes an expected bit rate for encoding of the residuals.

29. A method according to claim 28 further comprising estimating the expected bit rate for encoding the residuals by modeling residual values using a Laplacian distribution, and estimating the entropy of the distribution using an estimated mean absolute value for the residual.

30. A method according to claim 29 wherein the order of the predictor having minimum entropy is selected as the order of the predictor having the smallest estimated mean absolute value for the residual.

31. A method according to claim 23 wherein encoding a residual includes quantizing a coefficient value in accordance with predefined quantization settings.

32. A method according to claim 22 wherein the steps of receiving a sample, determining an active signal sequence and encoding the current sample are performed in accordance with a frame structure which is completely known a priori, such that no frame estimation processing is required.

33. A method according to claim 22 wherein the steps of receiving a sample, determining an active signal sequence and encoding the current sample are performed in accordance with a frame structure which is unknown or only partially known a priori, such that the frame structure must be completely or partially estimated.

34. A method according to claim 22 wherein the steps of receiving a sample, determining an active signal sequence and encoding the current sample are repeated for each of a plurality of samples.

35. A method according to claim 22 wherein each node of the tree structure is associated with a candidate signal sequence within the multiplexed data;

a level within the tree structure at which a node is located determines the rate at which the corresponding signal sequence is sampled, with higher sample rates associated with the lower levels of the tree that are closer to the root node and lower sample rates associated with the higher levels of the tree structure;

the root node of the tree structure is associated with a candidate signal sequence comprising every sample within the frame structure, sampled at the full rate of the data;

each node in the tree structure except for the node(s) at the highest level of the tree structure, furthest from the root node branches to N child nodes; and the N child nodes of a parent node are associated with N signal sequences interleaved at equal sample spacing whose samples collectively comprise the samples of the signal sequence associated with the parent node.

* * * * *